US006589834B1

United States Patent
Reddy et al.

(10) Patent No.: US 6,589,834 B1
(45) Date of Patent: Jul. 8, 2003

(54) SEMICONDUCTOR CHIP THAT ISOLATES DRAM CELLS FROM THE PERIPHERAL CIRCUITRY AND REDUCES THE CELL LEAKAGE CURRENT

(75) Inventors: Chitranjan N. Reddy, Los Alto Hills, CA (US); Ritu Shrivastava, Fremont, CA (US)

(73) Assignee: Alliance Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/848,627

(22) Filed: May 3, 2001

Related U.S. Application Data

(62) Division of application No. 09/167,255, filed on Oct. 6, 1998, now abandoned.

(51) Int. Cl.[7] ............... H01L 21/8238; H01L 21/8242; H01L 21/76
(52) U.S. Cl. ............ 438/210; 438/220; 438/224; 438/228; 438/241; 438/276; 438/414
(58) Field of Search ............... 438/210, 220, 438/224, 228, 241, 414, 275, 276

(56) References Cited

U.S. PATENT DOCUMENTS

| | | | |
|---|---|---|---|
| 5,079,613 A | 1/1992 | Sawada et al. ............. 257/409 |
| 5,260,226 A | 11/1993 | Sawada et al. ............. 438/210 |
| 5,373,476 A | 12/1994 | Jeon ............................ 365/226 |
| 5,386,135 A | 1/1995 | Nakazato et al. ........... 257/369 |
| 5,519,243 A | * 5/1996 | Kikuda et al. .............. 257/371 |
| 5,576,570 A | * 11/1996 | Ohsawa et al. ............. 257/369 |
| RE35,613 E | 9/1997 | Yasuda et al. .............. 257/371 |
| 5,789,286 A | * 8/1998 | Subbanna ................... 438/221 |
| 5,789,788 A | * 8/1998 | Ema et al. ................... 257/371 |
| 5,847,432 A | * 12/1998 | Nozaki ........................ 257/369 |
| 6,033,945 A | * 3/2000 | Ong ............................ 438/200 |
| 6,228,704 B1 | * 5/2001 | Uchida ........................ 438/241 |
| 2002/0031882 A1 | * 3/2002 | Uchida ........................ 438/228 |

* cited by examiner

*Primary Examiner*—Amir Zarabian
*Assistant Examiner*—Toniae M. Thomas
(74) *Attorney, Agent, or Firm*—Stallman & Pollock LLP

(57) ABSTRACT

The dynamic random access memory (DRAM) cells in a semiconductor chip are isolated from the peripheral circuitry by forming the DRAM cells directly in the substrate while the peripheral and other functional circuits are formed in wells that are isolated from the substrate. In addition to providing isolation, the placement of the DRAM cells also reduces the leakage current in the cells, thereby increasing the time that a DRAM cell can hold a charge without being refreshed.

3 Claims, 2 Drawing Sheets

SEMICONDUCTOR CHIP THAT ISOLATES DRAM CELLS FROM THE PERIPHERAL CIRCUITRY AND REDUCES THE CELL LEAKAGE CURRENT

RELATED APPLICATION

This application is a divisional of Application Ser. No. 09/167,255, filed Oct. 6, 1998, now abandoned.

BACKGROUND OF THE INVENTION

1. Field of the Invention.

The present invention relates to semiconductor chips having dynamic random access memory (DRAM) cells and, more particularly, to a semiconductor chip that isolates the DRAM cells from the peripheral and other functional circuitry, and reduces the leakage current in the cells.

2. Description of the Related Art.

A dynamic random access memory (DRAM) cell is a memory device that retains data stored in the cell for only a short period of time even when power is continuously applied to the cell. As a result, a DRAM cell must be periodically refreshed to maintain the data stored in the cell.

FIG. 1 shows a cross-sectional diagram that illustrates a conventional DRAM cell 100. As shown in FIG. 1, DRAM cell 100 includes an access transistor 102 which is formed in a p-type material 110, and a capacitor 104 which is connected to transistor 102.

Access transistor 102, in turn, includes spaced-apart source and drain regions 112 and 114 which are formed in material 110, and a channel region 116 which is defined between regions 112 and 114. In addition, transistor 102 also includes an access gate 120 which is insulatively formed over channel region 116.

As further shown in FIG. 1, capacitor 104 includes a lower plate 124 which is connected to drain region 114, a dielectric layer 126 which is formed over lower plate 124, and an upper plate 128 which is formed over dielectric layer 126.

In operation, a logic "one" is written to DRAM cell 100 by first placing a programming voltage, such as five volts, on source region 112 while a storage voltage, such as five volts, is applied to the top plate 126 of capacitor 104. The storage voltage applied to capacitor 104 attracts electrons to the lower plate 124 of capacitor 104 where the electrons begin to accumulate.

After placing a programming voltage on source region 112, access gate 120 is pulsed with the programming voltage. This pulse turns on access transistor 102 which causes the electrons on the lower plate 124 of capacitor 104 to flow to source region 112.

The electrons flow from the lower plate 124 of capacitor 104 to source region 112 because the lower plate 124 of capacitor 104 has a potential which is less than five volts (some of the applied voltage is dropped across dielectric layer 126), while source region 112 is at five volts.

When the trailing edge of the pulse again turns off access transistor 102, a positive potential is stored on the lower plate 124 of capacitor 104 due to the decreased number of electrons which are present on the lower plate 124 of capacitor 104.

This positive potential, however, lasts only a short time because electrons from leakage currents are readily attracted to the positive potential. As a result, the positive charge stored on the lower plate 124 of capacitor 104 must be "refreshed" by periodically removing the electrons from the lower plate 124 of capacitor 104.

Although some applications exist for a single DRAM cell, large numbers of DRAM cells, organized in an array, are formed on a semiconductor chip. In addition to the DRAM cells, the chip also includes peripheral circuits which control various aspects of the array, and may also include other functional circuits, such as a graphics accelerator, which have been integrated to operate with the DRAM cells.

The peripheral circuits include, for example, refresh circuits which maintain the data stored in the cells, row and column decoders which identify the cells which have been addressed, and sense amps which detect the states of the data held in the addressed cells.

FIG. 2 shows a cross-sectional drawing that illustrates a prior art semiconductor chip 200. As shown in FIG. 2, chip 200 includes a p-type substrate 210, and a first n-well 212 which is formed in substrate 210. In addition, chip 200 also includes a p-well 214 which is formed in n-well 212, and a second n-well 216 which is formed in substrate 210. Due to the presence of three wells in substrate 210, this arrangement is commonly referred to as a triple-well structure.

As further shown in FIG. 2, a p+ diffusion region 220 and a plurality of n-channel transistors, as represented by n-channel transistor 222, are formed in p-type substrate 210. N-channel transistor 222, in turn, includes spaced-apart source and drain regions 224 and 226, a channel region 230 which is defined between source and drain regions 224 and 226, and a gate 232 which is insulatively formed over channel region 230.

In addition, an n+ diffusion region 234 and a plurality of p-channel transistors, as represented by p-channel transistor 236, are formed in n-well 216. P-channel transistor 236, in turn, includes spaced-apart source and drain regions 240 and 242, a channel region 244 which is defined between source and drain regions 240 and 242, and a gate 246 which is insulatively formed over channel region 244. N-channel and p-channel transistors 222 and 236, in turn, are utilized to implement the peripheral and any other functional circuitry, such as a graphics accelerator.

Further, an n+ diffusion region 248 is formed in n-well 212, while a p+ diffusion region 250 and a plurality of DRAM cells, as represented by DRAM cell 252, are formed in p-well 214. DRAM cell 252 includes spaced-apart source and drain regions 254 and 256, and a channel region 260 which is defined between regions 254 and 256. In addition, DRAM cell 252 also includes an access gate 262 which is insulatively formed over channel region 260, and a capacitor 264 which is formed over drain region 256.

DRAM cells 252 are formed in p-well 214, which is formed in n-well 212, for isolation. One of the most important requirements of an array of DRAM cells is that the array be electrically isolated from the large number of noise electrons that are generated by the peripheral and any other functional circuits. (Graphics accelerators, for example, generate many noise electrons). Without this isolation, these noise electrons will quickly reduce the positive charge stored on the lower plate of capacitor 264, thereby leading to a substantially increased refresh rate.

In operation, isolation is obtained by reverse-biasing the p-well to first n-well junction, the first n-well to p-type substrate junction, and the second n-well to p-type substrate junction. The p-well to first n-well junction is reverse biased by applying ground or a negative voltage to p+ diffusion region 250, and a positive voltage, such as Vcc, to n+ diffusion region 248.

The junction between first n-well 212 and p-type substrate 210, and the junction between second n-well 216 and p-type substrate 210 are reverse biased by applying the positive voltage to n+ diffusion regions 234 and 248 while applying ground to p+ diffusion region 220.

Although noise from the peripheral and other functional circuits is effectively eliminated by utilizing wells 212 and 214, the data retention time of DRAM cell 252 is still limited by a small junction leakage current that injects electrons into drain region 256.

Reverse-biased pn junctions inherently possess a small leakage current that results from thermally and other randomly generated electron-hole pairs that are formed within a diffusion length of the junction. When a logic one is stored by DRAM cell 252, drain region 256 has a positive charge, while p-well 214 is connected to ground or a negative voltage. As a result, the junction between drain region 256 and p-well 214 is reverse biased which, in turn, causes electrons to be injected into drain region 256.

In addition, the ion implantation process used to fabricate wells 212 and 214 damages the silicon lattice structure. As a result of this damage, gettering sites are often formed in the lattice in the junction region between drain region 256 and p-well 214. These gettering sites, in turn, can lead to substantially increased junction leakage currents that significantly decrease the time that a positive charge can be stored on the lower plate of the capacitor.

Thus, there is a need for a semiconductor chip that electrically isolates the DRAM cells from the peripheral and other functional circuitry while at the same time reducing the junction leakage current.

SUMMARY OF THE INVENTION

Conventionally, the dynamic random access memory (DRAM) cells in a semiconductor chip are isolated from the peripheral and other functional circuitry by placing the cells in a p-well which is formed in an n-well which, in turn, is formed in the substrate. The p-well to n-well and n-well to substrate junctions are then reverse biased to provide the needed isolation. This structure, however, increases the leakage current in the cell due to lattice damage that occurs during the formation of the wells.

The semiconductor chip of the present invention provides the needed isolation and reduces the cell leakage current by forming the DRAM cells directly in the substrate, and the peripheral and other functional circuitry in wells that are isolated from the substrate.

A semiconductor chip in accordance with the present invention includes a substrate of a first conductivity type, and a first well of a second conductivity type which is formed in the substrate. In addition, the semiconductor chip also includes a second well of the first conductivity type which is formed in the first well, and a third well of the second conductivity type which is formed in the substrate.

Further, the semiconductor chip of the present invention additionally includes peripheral circuitry which is formed in the second and third wells, and a plurality of DRAM cells which are formed in the substrate.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
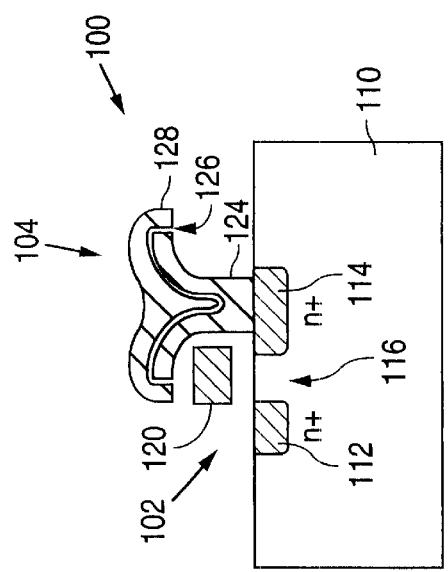
FIG. 1 is a cross-sectional diagram illustrating a conventional DRAM cell 100.
Figure 2:
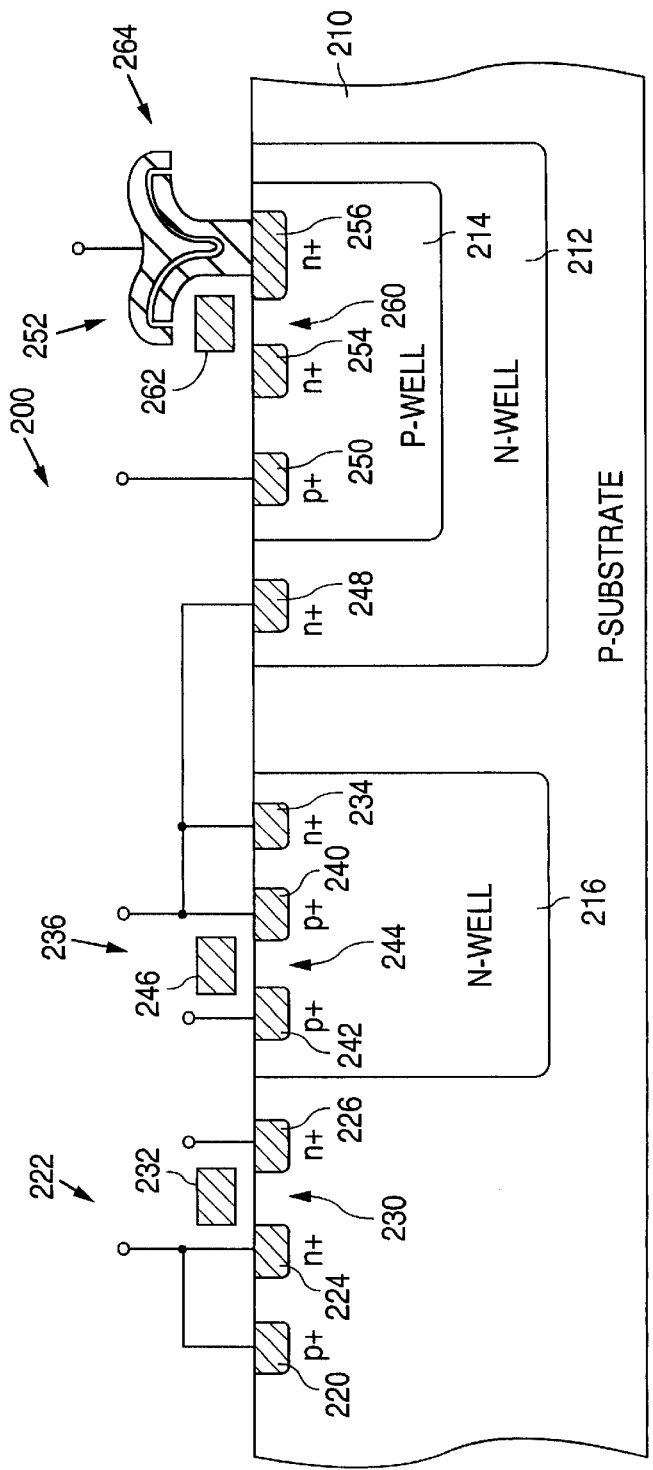
FIG. 2 is a cross-sectional drawing illustrating a prior art semiconductor chip 200.
Figure 3:
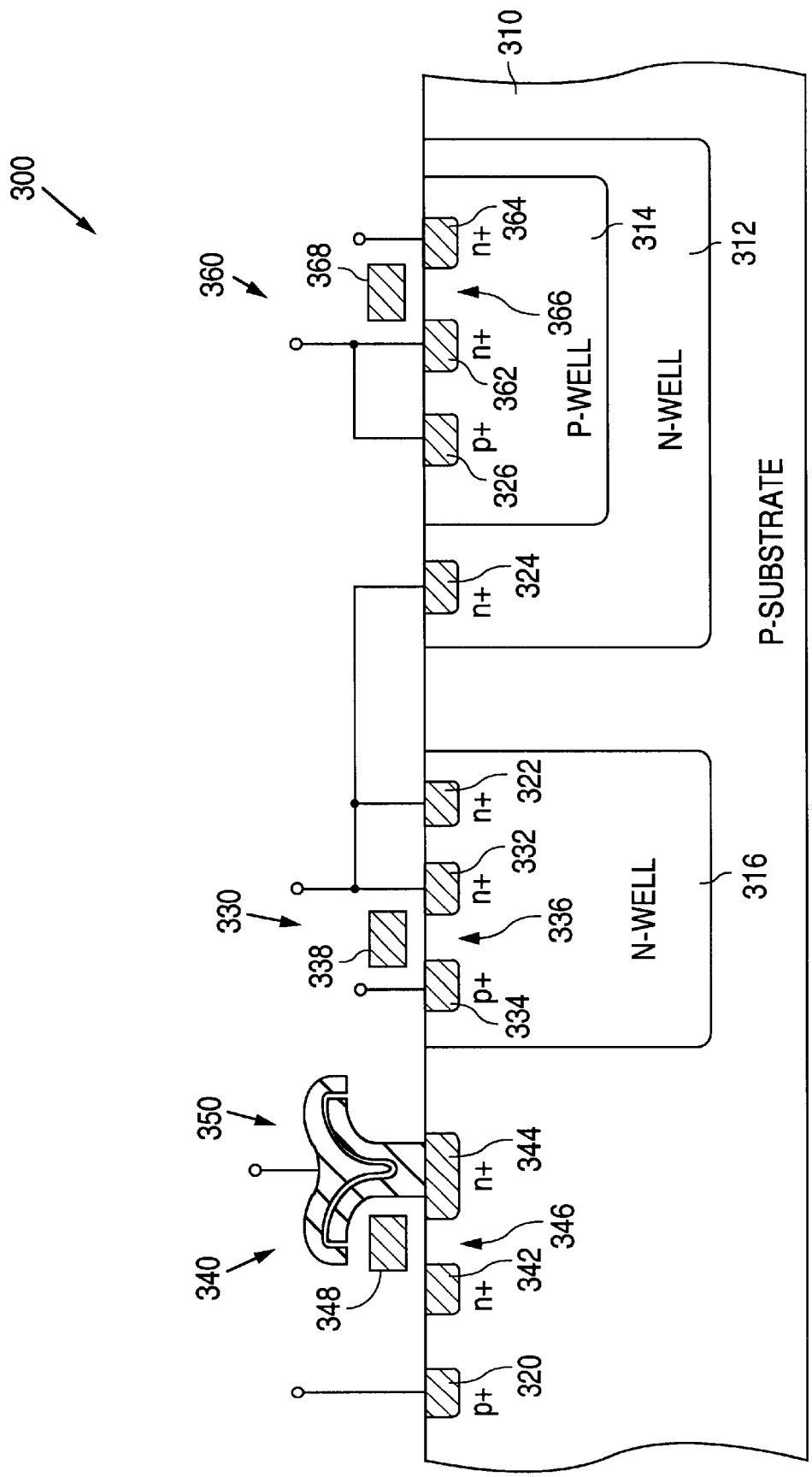
FIG. 3 is a cross-sectional drawing illustrating a semiconductor chip 300 in accordance with the present invention.

FIG. 3 shows a cross-sectional drawing that illustrates a semiconductor chip 300 in accordance with the present invention. As shown in FIG. 3, chip 300, like chip 200, includes a p-type substrate 310, a first n-well 312 which is formed in substrate 310, a p-well 314 which is formed in n-well 312, and a second n-well 316 which is formed in substrate 310. Unlike chip 200, however, the dopant concentration of n-well 312 is less than the dopant concentration of n-well 316.

As further shown in FIG. 3, chip 300, like chip 200, also includes a p+ diffusion region 320 which is formed in substrate 310, an n+ diffusion region 322 which is formed in second n-well 316, an n+ diffusion region 324 which is formed in first n-well 312, and a p+ diffusion region 326 which is formed in p-well 314.

In addition, chip 300, like chip 200, further includes a plurality of p-channel transistors, as represented by p-channel transistor 330, which are formed in second n-well 316. P-channel transistor 330, in turn, includes spaced-apart source and drain regions 332 and 334, a channel region 336 which is defined between source and drain regions 332 and 334, and a gate 338 which is insulatively formed over channel region 336.

In accordance with the present invention, chip 300 includes a plurality of DRAM cells, as represented by DRAM cell 340, which are formed directly in p-type substrate 310 rather than being formed in p-well 214 as was the case with chip 200.

In addition, chip 300 also includes a plurality of n-channel transistors, as represented by n-channel transistor 360, which are formed in p-well 314 rather than being formed in p-substrate 210 as was the case with chip 200.

DRAM-cell 340 includes spaced-apart source and drain regions 342 and 344, and a channel region 346 which is defined between regions 342 and 344. In addition, DRAM cell 340 also includes an access gate 348 which is insulatively formed over channel region 346, and a capacitor 350 which is formed over drain region 344.

N-channel transistor 360, in turn, includes spaced-apart source and drain regions 362 and 364, a channel region 366 which is defined between source and drain regions 362 and 364, and a gate 368 which is insulatively formed over channel region 366.

By placing n-channel transistors 360 in p-well 314 and DRAM cells 340 in substrate 310, DRAM cells 340 remain isolated from the peripheral and other functional circuitry, such as a graphics accelerator, by reverse biasing the junction between p-type substrate 310 and n-well 312, the junction between p-type substrate 310 and n-well 316, and the junction between n-well 312 and p-well 314.

Further, by placing DRAM cells 340 in substrate 310, the lattice damage that results from the ion implantation steps used to form wells 312 and 314 is eliminated from the junction between drain region 344 and the surrounding p-type material. As a result, the increased leakage current that results from the lattice damage is eliminated.

Thus, in accordance with the present invention, a semiconductor chip has been disclosed that isolates the DRAM cells from the peripheral circuitry, and reduces the leakage current in the cells, by forming the DRAM cells directly in the p-type substrate. In addition, the p-channel transistors of the peripheral circuits are formed in an n-well which is formed in the substrate, while the n-channel transistors of the peripheral circuits are formed in a p-well which is formed in an n-well which, in turn, is formed in the substrate.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method of forming a dynamic random access memory (DRAM) integrated circuit structure, the method comprising:

providing a p-type semiconductor substrate;

forming a first n-type well in the semiconductor substrate to define a first pn junction between the first n-type well and the p-type semiconductor substrate, the first n-type well having a first dopant concentration;

forming a second n-type well in the semiconductor substrate that is spaced apart from the first n-type well, the second n-type well defining a second pn junction between the second n-type well and the p-type semiconductor substrate, the second n-type well having a dopant concentration that is greater than the first dopant concentration of the first n-type well;

forming a p-type well in the first n-type well to define a third pn junction between the p-type well and the first n-type well;

forming a plurality of DRAM storage cells comprising a DRAM storage cell array directly in the p-type semiconductor substrate; and forming a plurality p-type transistors in the second n-type well and a plurality of n-type transistors in the p-type well.

2. The method of claim 1, and wherein the DRAM integrated circuit structure includes the DRAM storage cell array formed directly in the p-type semiconductor substrate and peripheral circuitry for the DRAM storage cell array, the peripheral circuitry including the plurality of p-type transistors formed in the second n-type well and the plurality of n-type transistors formed in the p-type well.

3. The method of claim 1, and further comprising:

forming a first electrical contact to the p-type semiconductor substrate, the first electrical contact being connectable to a first voltage supply;

forming a second electrical contact to both the first n-type well and the second n-type well, the second electrical contact being connectable to a second voltage supply that is different than the first voltage supply; and forming a third electrical contact to the p-type well, the third electrical contact being connectable to a third voltage supply that is different than the first and second voltage supplies.

* * * * *